(12) United States Patent
Marshall et al.

(10) Patent No.: US 6,628,540 B2
(45) Date of Patent: Sep. 30, 2003

(54) BIAS CELL FOR FOUR TRANSISTOR (4T) SRAM OPERATION

(75) Inventors: Andrew Marshall, Dallas, TX (US); Theodore W. Houston, Richardson, TX (US); Sreedhar Natarajan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/036,324

(22) Filed: Dec. 31, 2001

(65) Prior Publication Data

US 2002/0105825 A1 Aug. 8, 2002

Related U.S. Application Data

(60) Provisional application No. 60/259,299, filed on Dec. 31, 2000.

(51) Int. Cl.[7] .............................................. G11C 11/00
(52) U.S. Cl. .................. 365/154; 365/156; 365/230.06
(58) Field of Search ................................. 365/154, 156, 365/230.06, 189.09

(56) References Cited

U.S. PATENT DOCUMENTS

| | | | | |
|---|---|---|---|---|
| 5,473,568 A | * | 12/1995 | Okamura | 365/156 |
| 5,793,671 A | * | 8/1998 | Selcuk | 365/154 |
| 6,087,813 A | * | 7/2000 | Tobita | 323/280 |
| 6,212,124 B1 | * | 4/2001 | Noda | 365/230.06 |

* cited by examiner

*Primary Examiner*—Huan Hoang
(74) *Attorney, Agent, or Firm*—W. James Brady, III; Frederick J. Teleky, Jr.

(57) ABSTRACT

Quiescent current drawn by an array of four-transistor loadless static random access memory (SRAM) cells is minimized by using a negative feedback loop to set a reference voltage, for the wordline driver, to a level which reduces the subthreshold current through the pass transistors to a level which is just barely sufficient to reliably retain data.

12 Claims, 2 Drawing Sheets

BIAS CELL FOR FOUR TRANSISTOR (4T) SRAM OPERATION

CROSS-REFERENCE TO OTHER APPLICATION

This application claims priority from 60/259,299 filed Dec. 31, 2000, which is hereby incorporated by reference.

BACKGROUND AND SUMMARY OF THE INVENTION

The present invention relates to integrated circuit memory circuits and operation methods.

Background: 4-Transistor Loadless SRAM

The four-transistor loadless SRAM cell ("4T-LL-SRAM") is a recently-developed CMOS memory cell in which the states of the two data nodes are maintained in a distinctive way: not by a cross-coupled P-channel pair (as in the 6T cell), nor by resistive load elements (as in the old 4T NMOS cell), nor by refresh cycles (as in the 4T DRAM cells of the 1970s), but simply by leakage from the same pair of PMOS transistors which provide the pass gates for the cell. This cell, and various ways to use it, are described, for example, in copending U.S. provisional applications 60/259,276 filed Dec. 31, 2000 and 60/259,312 filed Dec. 31, 2000, both of which are hereby incorporated by reference.

For data retention, the high node must stay above a minimum voltage which is high enough to keep the opposite driver transistor reliably turned on. Thus the data retention requirement is that the P-channel pass transistor must source as much or more current to the high node, at this minimum voltage, as is sinked from the high node by leakage. The amount of current sourced by the pass transistors will be determined by the word line voltage: lower wordline voltages will cause the P-channel transistors in each cell to pass more current.

Despite the prospective advantages of the 4T-LL cell (e.g. less area than the 6T SRAM cell), it has not been extensively used. The primary reason is due to problems in optimizing the leakage current of the PMOS devices; if the leakage current of the P-channel devices is too low, data retention will be jeopardized; if leakage current is too high, excess power consumption will occur.

FIG. 4 shows the basic 4T-LL SRAM cell. The cross-coupled N-channel driver transistors 410 drive a pair of data nodes. A pair of P-channel pass transistors 420, gated by a wordline WL\, connect these nodes to a pair of bitlines (not shown) when the wordline goes low. When access is not occurring, the P-channel pass transistors pass enough leakage current to keep one of the two nodes high. (Note that the pass transistors are not actually on: they simply pass a subthreshold leakage current which is enough to compensate for the modest subthreshold leakage current of the N-channel driver transistor which is pulling down the high node.)

Thus the leakage current of the PMOS devices must be maintained to a level higher than that of the NMOS. Until recently this was done by engineering the cell and process to minimize leakage for the NMOS and maximize leakage for the PMOS. This resulted in a cell with excessive leakage, particularly at high temperatures.

A more recent approach utilizes biasing the 4T cell PMOS devices to maintain a higher leakage than the NMOS devices. This results in reduced cell size, but the resulting cell is not a low current cell. (See e.g. K. Takeda et al., "A 16 Mb 400 MHz loadless CMOS Four-Transistor SRAM Macro", ISSCC 2000, Paper TP16.1, which is hereby incorporated by reference.) In fact, the Takeda et al. paper specifically tries to keep the storage node very close to supply, increasing the leakage current to a very high level.

A particular quirk of the loadless 4T-SRAM cells is the importance of gate leakage components. The present inventors have realized that both gate leakage and subthreshold conduction are significant components of the balance of leakage currents. This makes optimization even more difficult.

Another quirk of the 4T-LL cell is that both high-temperature and low-temperature conditions are likely to be failure points for data retention.

Another difficulty in minimizing power consumption of the 4T-LL cell is that subthreshold conduction is sharply dependent on gate voltage, and thus the wordline voltage (under quiescent conditions) will very strong affect the power dissipation.

4T-LL SRAM Array with Quiescent Bias Referenced to Subthreshold Conduction of Parallelled Dummy Cells The present application discloses an integrated circuit memory architecture in which a reference circuit monitors a reference array of SRAM cells, and adjusts the PMOS gate voltage of the data-containing cells to achieve a minimum storage voltage. This minimizes power consumption without jeopardizing data retention.

Advantages of the disclosed methods and structures, in various embodiments, can include one or more of the following:

Low power consumption;

Reduction of power consumption without increase in process complexity;

Joint optimization of power consumption, process complexity, speed, and bit error rate; and Optimal (low) power consumption over the full range of permissible variation in temperature and supply voltage.

This is the first loadless-4T reference supply to include adjustment for gate leakage components. This will be particularly advantageous with the thin oxide 4T cell designs that will be developed in the next few months and years.

Another advantage is that implementation of 4T-LL-SRAM avoids the requirement for high-VT P-channel devices (as normally used in 6T SRAM cells), though in practice the availability of a high-VT-pmos can be convenient for reducing power consumption (with a 4T-LL-SRAM) to the absolute minimum.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
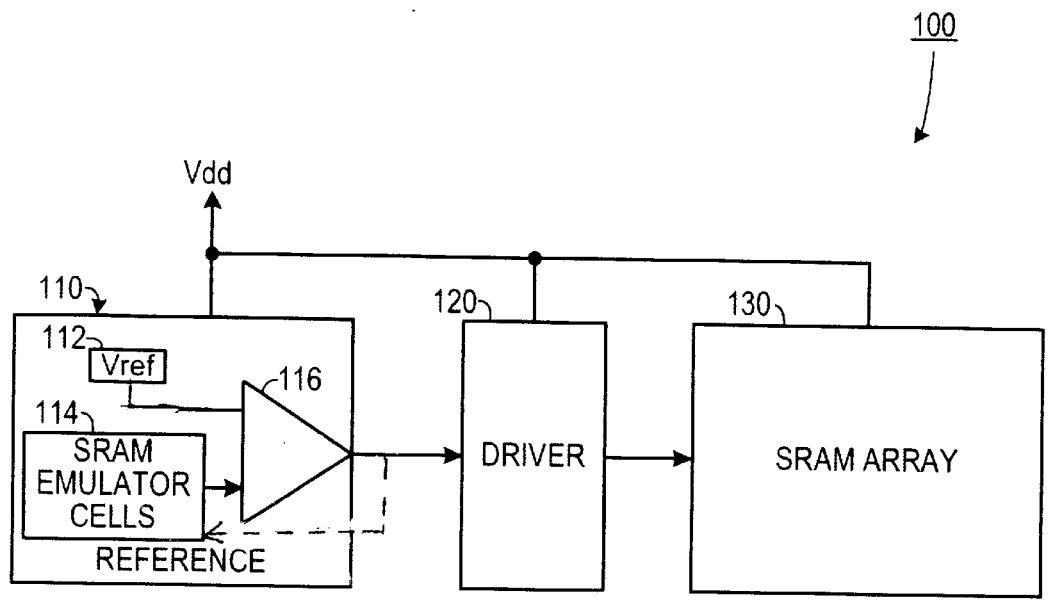
FIG. 1 is a block diagram of the driver circuitry used in the presently preferred embodiment.

FIG. 1 is a block diagram overview of a sample implementation. (The reference block, shown in more detail in FIG. 2, and driver section, shown in more detail in FIG. 3, complete the circuit design.) As FIG. 1 shows, there are two basic modules in this implementation of the SRAM driver cell. A reference module 110 derives a supply current and an output voltage for the driver module 120. The driver module 120, in the presently preferred embodiment, is a unity gain buffer, and is included to isolate the sensitive reference circuit from the wordline (on which switching noise appears).

Figure 2:
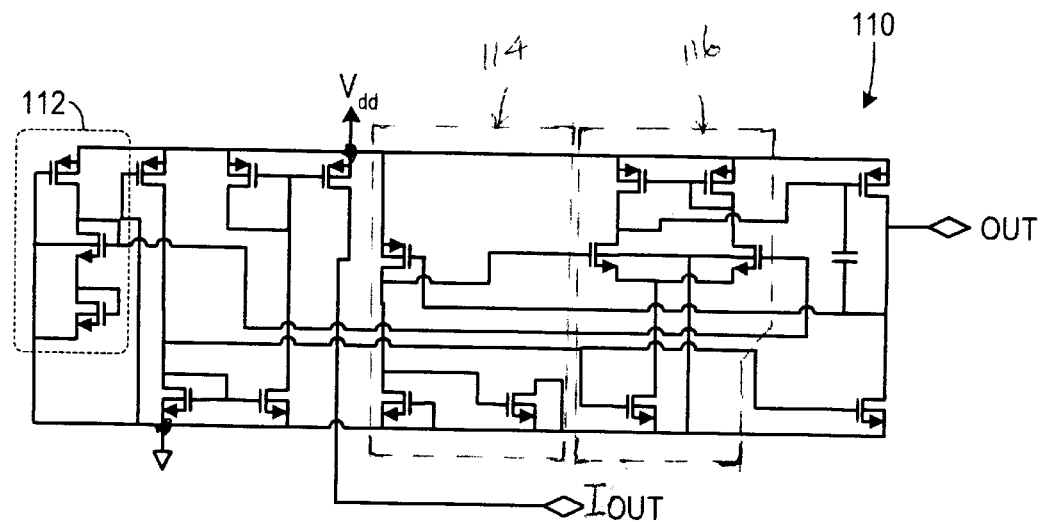
FIG. 2 shows a sample implementation of a reference module, derives a supply current and an output voltage for the wordline driver module.

FIG. 2 shows details of a sample implementation of the reference circuit 110. The three transistors of block 112 provide a reference voltage that is a Vt higher than the threshold voltage Vt of the SRAM cell's n-channel drivers. (This defines a minimum voltage which will sustain the SRAM storage node.) This is compared to the voltage required to maintain the reference voltage on the parallel configuration of ten SRAM cells 114. (For compactness, only one is shown.) Each SRAM cell 114 is configured into a known state (the storage state) by not connecting the PMOS to the right hand side of the cell. This means that the output voltage is adjusted to the point where the SRAM cell just maintains the minimum required storage voltage, as opposed to the prior art, where the storage node was maintained much higher (less than 100 mV from supply). The SRAM cell also includes leakage through the gate, which is an issue reducing the storage voltage at low temperatures, where the transistor leakage is reduced but the gate leakage remains relatively constant.

Figure 3:
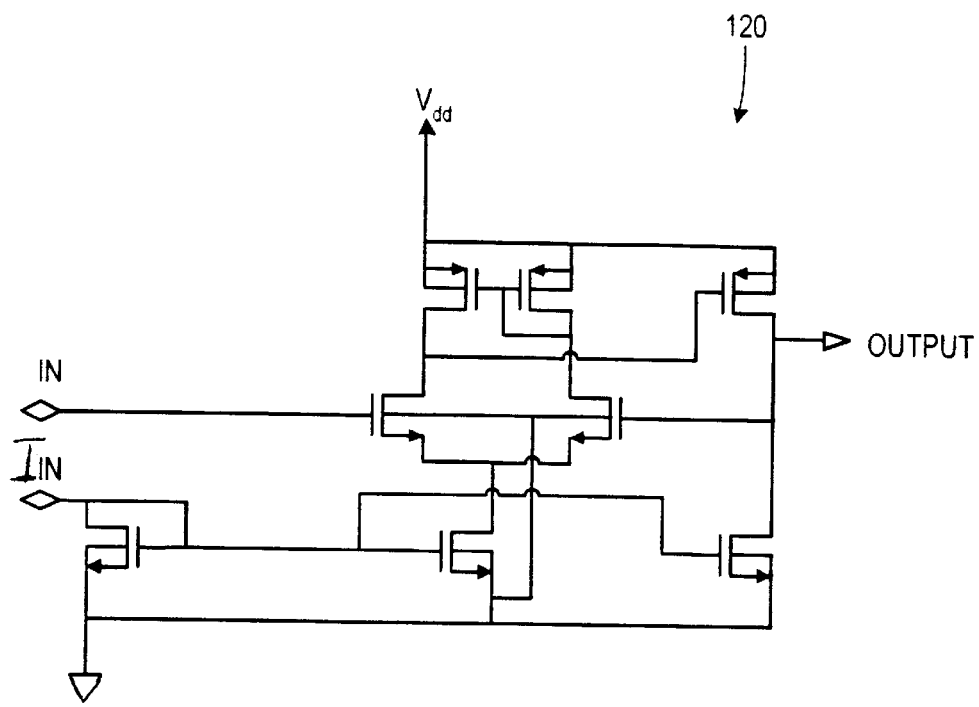
FIG. 3 shows a sample implementation of the wordline driver module, which isolates the sensitive reference circuit from the word-line.
Figure 4:
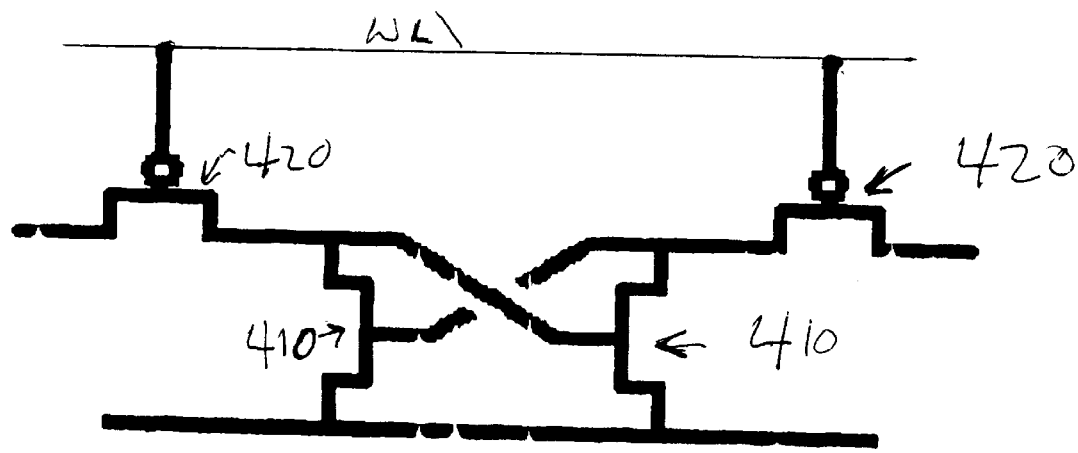
FIG. 4 shows the basic loadless-4T cell.

FIG. 3 shows the implementation of the driver stage 120, in the presently preferred embodiment. This is a basic unity gain buffer, which is included to provide enough current for the read/write cycle of the 4T operation, and to minimize the feedback to the sensitive reference cell.

For convenience, a small bias current is copied from the reference stage 110 into the driver stage 120 (through the connection from terminal $I_{OUT}$ in FIG. 2 to terminal $I_{IN}$ in FIG. 3), but this is merely a design implementation feature which is not particularly critical for the functionality described above.

As will be recognized by those of ordinary skill in the art, numerous other peripheral circuits will be used, in combination with those of FIGS. 1–3, to operate the array 130 in all modes. However, the circuitry in FIGS. 1–3 above is sufficient to set an optimal level for the quiescent wordline voltage, and is preferably so used in combination with other peripheral circuits which are more conventional. (See e.g. Betty Prince, Semiconductor Memories (2.ed. 1996), which is hereby incorporated by reference.)

As shown in FIG. 1, the present application provides a controller 100 for an array of static random access memory (SRAM) cells 130. Typically, the SRAM cells each have N-channel transistors cross-coupled to drive a data node and at least one P-channel transistor configured to apply voltage to the N-channel transistors to sustain the N-channel transistors in the high data state. The controller 100 includes a reference circuit 110 that determines when the charge applied to the SRAM cell array 130 has fallen below the minimum level necessary to maintain the data state of the SRAM cells in the array 130. When the charge falls below the minimum threshold level, the reference circuit asserts a signal to a driver 120 that delivers current to the pass gate transistors of the SRAM cells, thereby bringing up the voltage of the pass gate transistors.

The reference circuit 110 includes a circuit 112 for generating a reference voltage, typically having a value that is twice the voltage necessary to sustain the data state of the SRAM cells in the array 130. A plurality of SRAM cells 114 emulate the cells in the array 130 and provide an estimate of the voltage of the cells in the array 130. The cells 114 in the reference circuit 110 are of the type used in the array 130 and are written with a high data state at the outset of use and each time driver writes to the SRAM array. A comparator 116 determines when the voltage of the SRAM cells 114 in the reference circuit 110 has fallen below the reference voltage and asserts a signal to the driver 120 when the SRAM cell 114 voltage has fallen below the reference voltage. A more detailed view of one illustrative embodiment the reference circuit 110 is shown in FIG. 2 and a more detailed view of one illustrative embodiment of the driver circuit 130 is shown in FIG. 3. In use, the reference (or emulator) cells 114 are set to an initial state (such as a data 1). When the comparator 116 determines that the emulator cells 114 have a voltage below the threshold necessary to sustain the data state of the SRAM array 130, the driver circuit 120 applies current to the data SRAM array 130. The state of the emulator SRAM cells 114 is then reset to their initial state and the cycle repeats itself.

In one illustrative embodiment, the reference controller 100 has been implemented on a chip as the word line controller for a 2 MEG space from 4-T SRAM circuit. The controller adjusts the PMOS gate voltage to achieve a minimum storage voltage. The reference module 110 drives a supply current and an output voltage for the driver module 120. The driver module 120 may be a unity gain buffer, and is included to isolate the sensitive reference circuit from the switching word line. The unity gain buffer provides enough current for the read/right cycle of the 4-T operation, and minimizes feedback to the sensitive reference cells 114.

The transistors in the reference voltage generating circuit 112 provide a reference voltage that is a VT higher than the SRAM VT threshold. The SRAM VT and VT threshold is the lowest voltage that can sustain the SRAM storage node of the SRAM array 130. The reference voltage is compared to the voltage required to maintain the reference voltage on the parallel configuration of 10 SRAM cells. The SRAM emulator cells 114 are configured into a known state of (the storage gate) by not connecting the PMOS to the right hand side of the cell. This means of the output voltage is adjusted to the point where the SRAM cell just maintains the minimum required to storage voltage. The SRAM emulator cells 114 also include leakage through their gates. Such leakage reduces storage voltage at low temperatures. Transistor leakage is reduced by the gate leakage and remains relatively constant.

The invention represents a new concept in the generation of the reference 4-T cells, changing the designs from high current consumption circuits to a current requirement that is the minimum required to maintain an adequate storage voltage. This is achieved through the use of a voltage reference to the minimum requirement to maintain holds conditions, rather than an incremental voltage from supply, head. The multiple SRAM cell array is used in the adjustment of the voltage on the cell to the value high enough to guarantee an adequate storage voltage, but low enough to keep the 4-T quiescent current to a minimum.

The invention compensates for gate leakage current. This is important because, as SRAM devices get smaller, the thickness of the corresponding gates is reduced. This causes and increase of leakage through the gates. The emulator cells, having dimensions comparable to the data cells, experience corresponding gate leakage and are thus capable of compensating for actual gate leakage in the data cells. As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

According to a disclosed class of innovative embodiments, there is provided: An integrated circuit memory structure, comprising: an array of loadless-4T-SRAM memory cells, each comprising a cross-coupled pair of N-channel driver transistors and a pair of P-channel pass transistors gated by a wordline; and wordline-driver circuitry which drives said wordline, under at least some conditions, to a voltage which is defined by a differential amplifier stage in a negative feedback relationship which is at least partly dependent on the combination of: leakage current passed by P-channel transistors, and the threshold voltage of N-channel transistors; whereby static power consumption of said array is optimally minimized.

According to another disclosed class of innovative embodiments, there is provided: An integrated circuit memory structure, comprising: an array of leakage-stabilized memory cells; and a bias supply which operates in a feedback loop to adjust at least one bias voltage supplied to said array of cells, by monitoring power consumption in multiple dummy cells, to a value which minimizes power consumption while avoiding data loss; wherein said array of cells pass both gate leakage current and other leakage currents, and at least 1% of leakage current in said array of cells, under at least some permissible operating conditions, is gate leakage; and wherein said dummy cells pass both gate leakage current and other leakage currents.

According to another disclosed class of innovative embodiments, there is provided: An integrated circuit memory structure, comprising: an array of memory cells; and a bias supply which operates in a feedback loop to adjust at least one gate bias voltage supplied to leakage-compensating transistors in each of said cells to operate said leakage-compensating transistors in subthreshold mode to maintain data states despite leakage while minimizing power consumption.

According to another disclosed class of innovative embodiments, there is provided: A controller for an array of data static random access memory (SRAM) cells, each cell including a pass gate transistor, comprising: at least one emulator SRAM cell having a first node and a second node, a node voltage existing between the first node and the second node; a differential stage which compares the node voltage to a threshold voltage, and which adjusts a bias signal when the node voltage falls below the threshold voltage; and a buffer, responsive to said bias signal, that causes each of the pass gate transistors of the array of SRAM cells to change respective leakage currents thereof when said bias signal is adjusted.

According to another disclosed class of innovative embodiments, there is provided: A static random access memory (SRAM), comprising: a plurality of data SRAM cells, each including N-channel transistors cross-coupled to drive a data node and at least one P-channel transistor configured to apply a voltage to the N-channel transistors so as to sustain the N-channel transistors in at least one data state; at least one emulator SRAM cell, having electrical characteristics corresponding to at least one of the data SRAM cells; a threshold voltage source, that generates a threshold voltage of a predetermined value; a comparator that senses a node voltage at a node of at least one emulator cell and that senses the threshold voltage, the comparator generating a comparator output that has a first value when the voltage at the node of the emulator cell is not greater than the value of the threshold voltage and that has a second value, different from the first value, when the voltage at the node of the emulator cell is greater than the value of the threshold voltage; and a buffer, electrically coupled to the output of the comparator and to the P-channel transistors, that causes the P-channel transistors to increase the voltage to the N-channel transistors when the output of the comparator has the first value.

According to another disclosed class of innovative embodiments, there is provided: A method of operating an array of leakage-stabilized loadless static random access memory (SRAM) cells, comprising the steps of: monitoring a dummy node voltage which is driven by a first transistor, operating in subthreshold conduction; and driving a bias voltage, which is applied to said first transistor and to respective transistors in said cells of said array, in a feedback relation such that said dummy node voltage is driven toward a minimum target voltage; whereby said bias voltage minimizes power consumption in said array.

According to another disclosed class of innovative embodiments, there is provided: A method of operating an array of static random access memory (SRAM) cells, comprising the steps of: setting at least one emulator SRAM cell to an initial state; determining when the emulator SRAM cell has a node voltage below a minimum threshold; and adjusting a bias voltage to said emulator cell and also to said cells of said array when the emulator SRAM cell has said node voltage below said threshold.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While silicon technology has been used in a sample implementation, the teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

The disclosed inventions can be particularly advantageous for memory arrays in logic chips, since memory power consumption does not demand special tweaking of process parameters.

As will be recognized by those skilled in the art of analog memory peripheral circuits, the specific circuit implementations shown can be varied in many ways while still implementing the disclosed functions. For example, additional elements can be added for buffering, mirroring, reset, or power-down functions.

Similarly, the number of cells used in the reference stage does not have to be equal to that shown, and can be more or fewer.

Note that offset voltage and/or current components can be added without disrupting the functional relations described. While it is convenient to use a reference node voltage which is the same as the low-side storage node voltage in the memory array as an input to the differential amplifier, and to modulate the conductivity of a P-channel device which drives the reference node voltage by using an output voltage which is exactly the same as the bias voltage supplied to the array, neither of these equalities is strictly necessarily. As will be recognized by experienced analog design experts, offsets can be introduced in numerous ways while preserving the basic feedback relation described.

It is also possible to configure an "upside-down" version of the 4T-LL cell, in which the driver transistors are P-channel and the pass transistors are N-channel. While this is considered distinctly less preferable, the present invention can also be used to provide an optimal quiescent bias level in this technology too, simply by inverting the above-described circuits analogously to the inversion of the cell.

The use of multiple parallelled P-channel devices in the reference stage provides more current than would be provided by a single P-channel device in a storage cell. This in turn implies that the voltage of the corresponding node in the reference stage will be slightly higher than the corresponding storage node in cells of the array 130, and this provides some additional margin.

In one contemplated alternative embodiment, the multiple parallelled P-channel devices which are connected in the reference stage are physically positioned in different locations around the array 130. This provides additional assurance that the reference stage will see a composite value which is fairly indifferent to variation in device characteristics.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. An integrated circuit memory structure, comprising:
   an array of memory cells; and
   a bias supply which operates
      in a feedback loop
      to adjust at least one gate bias voltage supplied to leakage-compensating transistors in each of said cells
      to operate said leakage-compensating transistors in subthreshold mode to maintain data states despite leakage
      while minimizing power consumption.

2. The integrated circuit of claim 1, wherein each said memory cell is a loadless four-transistor CMOS SRAM cell.

3. The integrated circuit of claim 1, wherein each said memory cell is a loadless four-transistor CMOS SRAM cell having P-channel pass transistors and cross-coupled N-channel driver transistors.

4. A controller for an array of data static random access memory (SRAM) cells, each cell including a pass gate transistor, comprising:
   at least one emulator SRAM cell having a first node and a second node, a node voltage existing between the first node and the second node;
   a differential stage which compares the node voltage to a threshold voltage, and which adjusts a bias signal when the node voltage falls below the threshold voltage; and
   a buffer, responsive to said bias signal, that causes each of the pass gate transistors of the array of SRAM cells to change respective leakage currents thereof when said bias signal is adjusted.

5. The controller of claim 4, wherein said threshold voltage has a value that is a predetermined offset above a minimum value necessary to sustain an SRAM storage node.

6. A static random access memory (SRAM), comprising:
   a plurality of data SRAM cells, each including N-channel transistors cross-coupled to drive a data node and at least one P-channel transistor configured to apply a voltage to the N-channel transistors so as to sustain the N-channel transistors in at least one data state;
   at least one emulator SRAM cell, having electrical characteristics corresponding to at least one of the data SRAM cells;
   a threshold voltage source, that generates a threshold voltage of a predetermined value;
   a comparator that senses a node voltage at a node of at least one emulator cell and that senses the threshold voltage, the comparator generating a comparator output that has a first value when the voltage at the node of the emulator cell is not greater than the value of the threshold voltage and that has a second value, different from the first value, when the voltage at the node of the emulator cell is greater than the value of the threshold voltage; and
   a buffer, electrically coupled to the output of the comparator and to the P-channel transistors, that causes the P-channel transistors to increase the voltage to the N-channel transistors when the output of the comparator has the first value.

7. The memory of claim 6, wherein said threshold voltage has a value that is a predetermined offset above a minimum value necessary to sustain an SRAM storage node.

8. A method of operating an array of leakage-stabilized loadless static random access memory (SRAM) cells, comprising the steps of:
   (a.) monitoring a dummy node voltage which is driven by a first transistor, operating in subthreshold conduction; and
   (b.) driving a bias voltage, which is applied to said first transistor and to respective transistors in said cells of said array, in a feedback relation such that said dummy node voltage is driven toward a minimum target voltage;
      whereby said bias voltage minimizes power consumption in said array.

9. The method of claim 8, wherein each said cell is a loadless 4T CMOS SRAM cell.

10. The method of claim 8, wherein said dummy node voltage is driven by multiple ones of said first transistor operating in parallel.

11. The method of claim 8, wherein said minimum target voltage is defined by an offset from a threshold voltage of driver transistors of cells of said array.

12. A method of operating an array of static random access memory (SRAM) cells, comprising the steps of:
- (a.) setting at least one emulator SRAM cell to an initial state;
- (b.) determining when the emulator SRAM cell has a node voltage below a minimum threshold; and
- (c.) adjusting a bias voltage to said emulator cell and also to said cells of said array when the emulator SRAM cell has said node voltage below said threshold.

* * * * *